US008710452B2

(12) United States Patent
Henstra (10) Patent No.: US 8,710,452 B2
(45) Date of Patent: Apr. 29, 2014

(54) CHARGED PARTICLE SOURCE WITH INTEGRATED ELECTROSTATIC ENERGY FILTER

(75) Inventor: Alexander Henstra, Utrecht (NL)

(73) Assignee: Fei Company, Hillsboro, OR (US)

(*) Notice: Subject to any disclaimer, the term of this patent is extended or adjusted under 35 U.S.C. 154(b) by 332 days.

(21) Appl. No.: 13/294,067

(22) Filed: Nov. 10, 2011

(65) Prior Publication Data

US 2012/0112090 A1 May 10, 2012

Related U.S. Application Data

(60) Provisional application No. 61/412,065, filed on Nov. 10, 2010.

(30) Foreign Application Priority Data

Nov. 10, 2010 (EP) .................................. 10190706

(51) Int. Cl.
*G21K 1/08* (2006.01)
*H01J 3/14* (2006.01)
*H01J 3/26* (2006.01)
*H01J 49/22* (2006.01)

(52) U.S. Cl.
USPC ......... 250/396 R; 250/305; 250/398; 250/311

(58) Field of Classification Search
USPC ............... 250/305, 311, 398, 396 R, 396 ML
See application file for complete search history.

(56) References Cited

U.S. PATENT DOCUMENTS

| 5,126,565 A | 6/1992 | Rose |
| 5,448,063 A | 9/1995 | de Jong et al. |
| 5,798,524 A | 8/1998 | Kundmann et al. |
| 5,838,004 A | 11/1998 | Tiemeijer et al. |
| 6,218,664 B1 | 4/2001 | Krans et al. |
| 6,288,401 B1 | 9/2001 | Chang et al. |
| 6,489,621 B1 | 12/2002 | Frosien |
| 6,501,076 B1 | 12/2002 | Kelly et al. |

(Continued)

OTHER PUBLICATIONS

Gubbens, Alexander, et al., 'The GIF quantum, a next generation post-column imaging energy filter,' Ultramicroscopy, Jul. 2010, pp. 962-970, vol. 110, No. 8.

(Continued)

*Primary Examiner* — Jack Berman
*Assistant Examiner* — Meenakshi Sahu
(74) *Attorney, Agent, or Firm* — Scheinberg & Assoc., PC; Michael O. Scheinberg (57) ABSTRACT

A charged particle filter with an integrated energy filter, in which the charged particle emitter, the focusing electrodes, and the deflection electrodes are arranged round a straight axis. Where most energy filters used have a highly curved optical axis, and thus use parts with forms that are difficult to manufacture, the source according the invention uses electrodes surrounding a straight optical axis. A beam of charged particles can be deflected quite far from the axis showing respectable energy dispersion at an energy selecting slit without introducing coma or astigmatism that cannot be corrected, provided that some of the are formed as 120°/60°/120°/60°. Such electrodes can be attached to each other by gluing or brazing of ceramic, and then series of a highly concentric bores can be formed by, e.g., spark erosion.

20 Claims, 5 Drawing Sheets

(56) References Cited

U.S. PATENT DOCUMENTS

| | | |
|---|---|---|
| 6,770,878 B2 | 8/2004 | Uhlemann et al. |
| 7,034,315 B2 * | 4/2006 | Henstra et al. ............. 250/398 |
| 7,745,783 B2 | 6/2010 | Uhlemann |
| 7,847,266 B2 | 12/2010 | Zhou et al. |
| 7,919,749 B2 | 4/2011 | Zhou et al. |
| 7,999,225 B2 * | 8/2011 | Henstra ..................... 250/305 |
| 2002/0109089 A1 | 8/2002 | Krans et al. |
| 2010/0187436 A1 | 7/2010 | Frosien et al. |

OTHER PUBLICATIONS

Uhlemann, S., et al., "Experimental Set-Up of a Fully Electrostatic Monochromator for a 200 kV TEM," The Proceedings of the 15th International Congress on Electron Microscopy, Sep. 1-6, 2002, 2 pgs.

Benner, Gerd, et al., "Design and First Results of SESAM," Microscopy and Microanalysis, 2003, pp. 66-67, vol. 9, Suppl. 03.

Plies, Erich, et al., "Proposal of a Novel Highly Symmetric Wien Filter Monochromator," Microscopy and Microanalysis, 2003, pp. 28-29, vol. 9, Suppl. 03.

* cited by examiner

CHARGED PARTICLE SOURCE WITH INTEGRATED ELECTROSTATIC ENERGY FILTER

This application claims priority from U.S. Provisional Application 61/412,065, filed Nov. 10, 2010, which is hereby incorporated by reference.

TECHNICAL FIELD OF THE INVENTION

The invention relates to a charged particle source with integrated electrostatic energy filter.

BACKGROUND OF THE INVENTION

Such a particle source is known from U.S. Pat. No. 6,770,878, describing a charged particle source with an integrated omega filter. The charged particle source comprises an ion or electron emitter, such as a Schottky emitter, emitting charged particles in a cone along an axis. A beam defining aperture selects an axial part of the beam, and focusing electrodes image the source further on along the axis. A first hemispherical capacitor acting as a deflector bends the axis, followed by a second hemispherical capacitor bending the axis parallel to its original direction, but displaced. A third and a fourth hemispherical capacitor bend the axis back so that it is both parallel and aligned with its original direction, that is: before it entered the first deflector. The axis of the filter thus resembles the Greek letter Ω, hence its name.

Between the second and the third deflector the earlier mentioned focusing electrodes form an astigmatic image of the source. Due to the deflection of the axis the image shows energy dispersion. An energy selecting aperture or slit is placed in the image plane, and a part of the beam with a desired energy spread is selected from the beam and transmitted, while electrons with an energy spread outside the desired energy spread are intercepted.

It is thus clear that the mechanical symmetry axis of the electrode surfaces follow the optical axis of the filter.

It is noted that the known source is made to operate in one of two ways: a first setting in which energy filtering is achieved by bending the axis and thus the beam with the hemispherical capacitors so that an image is formed on the energy selecting aperture, and a second setting in which the four hemispherical capacitors are not excited, and the axis extends straight from the charged particle emitted to the output of the source, through small holes in the electrodes of the first and fourth capacitor. In this second setting no energy selection takes place.

It is a disadvantage of the known source that the hemispherical capacitors are off-axial, and both machining and aligning the mechanical parts forming these hemispherical capacitors is complicated.

A generalized version of the filter discussed in U.S. Pat. No. 6,770,878 is given in U.S. Pat. App. No. 2008/0290273 A1. Here not only the Ω filter, but also the a filter is discussed, as are the optics needed for the elimination of astigmatism. According to this application the skilled person (the expert) must first select a shape for the axis of the monochromator, e.g. an Ω or an α, resulting in a similar disadvantage as described for the U.S. Pat. No. 6,770,878.

It is an object of the invention to provide a remedy for these disadvantages.

SUMMARY OF THE INVENTION

The invention relates to a charged particle filter with an integrated energy filter. Where most filters used have a highly curved optical axis, and thus use parts with forms that are difficult to manufacture, the source according the invention uses electrodes surrounding a straight optical axis. Surprisingly the inventor found that it is well possible to deflect a beam of charged particles quite far from the axis showing respectable energy dispersion at an energy selecting slit without introducing coma or astigmatism that cannot be corrected, provided that some of the electrodes are formed as 120°/60°/120°/60°. Such electrodes can be attached to each other by gluing or brazing of ceramic, and then series of a highly concentric bores can be formed by e.g. spark erosion.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

The charged particle source according to the invention is characterized in that the charged particle emitter, the focusing electrodes, and the deflection electrodes are arranged around a straight axis.

The invention described herein is based on the insight that, although the charged particle beam significantly deviates from the axis, proper design of the source enable a design where electrodes (including multipoles) are centered round the straight axis. This is contrary to the belief, or even prejudice, of the skilled artisan that electrodes, where possible, should be centered round the beam to result in a module free of, for example, astigmatism and coma. The invention is further based on the insight that, by placing all the electrodes on the same straight axis the electrodes can be formed by a machining method that is suited to form concentric parts with high accuracy. Inventor recognized that it is, for example, possible to join the mechanical parts by first mounting metallic plates from which the electrodes are made onto each other (separated and electrically insulated from each other by e.g. a suitable ceramic that is brazed to the electrodes, or epoxy resin molded to them). A concentric machining method, such as spark erosion or using a lathe then results in highly concentric electrodes. Subsequent mounting of emitter and diaphragm (comprising the energy selecting slit) thus results in a source with high concentricity, and thus little rotational errors. As known to the skilled artisan a product with small rotational errors is needed to achieve small aberrations. Forming a source with small rotational errors by forming the parts as concentric parts is easier and thus cheaper than obtaining a comparable positional error in a non-concentric design.

It is noted that a positional error parallel to the plane of the electrodes (so: a displacement in the z-direction) does not result in large errors, and can in most cases be compensated by a slightly different excitation of the module, resulting in e.g. a slightly different lens action of the focusing electrodes.

It is mentioned that another particle source with integrated energy filter is known from U.S. Pat. No. 7,034,315 to Henstra et al. for "Particle source with selectable beam current and energy spread," which is assigned to the assignee of the present invention and which is incorporated herein by reference. Here an emitter and a lens are placed on an axis, and a beam defining aperture selects an eccentric (off-axial) part of the beam emitted by the source. This eccentric part of the beam illuminates the lens eccentrically and the lens forms a focus of the eccentric part of the beam. As the beam is eccentric, the formed focus shows chromatic aberrations, resulting in a line focus with energy dispersion. By now placing an energy selecting slit in the formed focus, only electrons with a selected energy will be transmitted through the slit. A deflector is used to deflect the electrons along the axis.

A disadvantage of this source is that the electrons exiting the source show different positions of the virtual spot for different energies. In other words, the electrons produced by this source seem to emanate from a position that is dependent on the energy of the electron and a sort of virtual "rainbow" source is formed.

Another disadvantage is that the emitter must have an emission pattern that results in a high brightness at the eccentric acceptance angle used.

Yet another disadvantage of this source is that the image of the emitter on the slit shows coma to such an extent, that the amount of current falling on the slit must be limited, and thereby also the current transmitted through the slit. It is mentioned that the size of the image should not be larger than the energy dispersion, as otherwise no energy selection can be achieved.

Preferably the energy selecting aperture of the source according to the invention is formed as a slit in a MEMs structure. As the deviation from the beam from the axis is small, typically between 1 and 5 mm, also the energy dispersion is small, typically between 1 and 5 µm. This necessitates small slits with a width in the order of 100 nm, which are best made in MEMS processes using semiconductor materials.

It is noted that the energy dispersion of the source depends on the excitation and the physical form and position of the electrodes, and that other transmitted energy spread, exit energy, etc., may be used.

For the discussion of the optics the effect of the electrodes is best discussed in two parts: a first part, the pre-slit optics, comprising the electrodes between emitter and diaphragm, and the post slit optics, comprising the electrodes on the other side of the diaphragm.

By forming one or more of the pre-slit electrodes as a quadrupole for generating a dipole field and a (weak) quadrupole field, astigmatism and/or coma of the image of the emitter on the diaphragm can be canceled, and when necessary also the (absolute) magnification in the X and the Y direction can be made identical so that the image of the emitter on the plane of the slit is a round image.

Similar to the pre-slit optics, post-slit optics (formed by the post-slit electrodes) can complete cancel residual coma and astigmatism as well as fulfilling the condition $|M_x|=|M_y|$ from the image on the slit to the beam exiting the source module, as a result of which the beam exiting the source module emanate from a round virtual spot, without coma and astigmatism.

By deflecting the beam back onto the axis, energy dispersion can be cancelled, as a result of which a beam exiting the source shows the same virtual position for all energies, contrary to the source described in U.S. Pat. No. 7,034,315.

In a preferred embodiment of the charged particle source according to the present invention the diaphragm comprises at least two energy selective apertures, the energy selective apertures having different dimensions and/or different positions from the axis.

By equipping the diaphragm with different apertures at different positions, the energy dispersion and/or the slit width can be different for the at least two apertures, thus enabling at least two different energy width and hence different currents of the transmitted beams.

In a preferred embodiment of the charged particle source according to the invention the energy selective diaphragm comprises at least two energy selective apertures, one aperture located at the axis for passing the central beam passes without energy filtering.

When the deflector electrodes are energized, the source is a monochromatizing source, producing a beam of charged particles with low energy spread, but often also with low current, as part of the charged particles are stopped by the energy selective diaphragm. By providing a central hole, preferably with a diameter larger than the diameter of the image of the emitter on the diaphragm, a larger current can be produced by the source when the deflection electrodes are not energized.

Alternatively the aperture is used as a Beam Limiting Aperture, limiting the beam current to a desired value. In that case a crossover is not located in the aperture.

In a preferred embodiment of the charged particle source according to the invention the particle emitter is an electron source of the group of thermionic sources, thermal field emitters, cold field emitters, Schottky emitters, carbon nanotubes, and semiconductor emitters, or an ion source of the group of liquid metal ion sources, gas ion sources, and liquid helium sources.

In a preferred embodiment of the charged particle source according to the invention in use the coma of the image formed on the energy selective diaphragm has a diameter less than the geometric image size of the emitter.

By designing and operating the source such that the coma of the image formed on the energy selecting diaphragm is smaller than the geometric image of the emitter, the energy spread below the aperture is not influenced (degraded) by said coma.

In a preferred embodiment of the charged particle source according to the invention additional electrodes are present for forming a cross-over between the emitter and the energy selective diaphragm.

By adding additional lens electrodes it is possible to magnify or demagnify the image of the emitter on the energy selecting diaphragm. This enables a trade-off between geometric image size and energy dispersion. The skilled artisan will understand that an emitter with a large diameter, such as a LaB6 source, is preferably demagnified so that the ratio between image size and energy dispersion is more favorable. On the other hand a cold field emitter is preferably magnified so that geometric emitter image at the diaphragm is larger, and the ratio between said diameter and (off-axial) aberrations more favorable (easier to make the aberrations smaller than the geometric spot size). Also the associated demagnification of the opening angle of the cold field emitter is an advantage, as this leads to, among others, smaller aberrations.

The charged particle source can be used in an instrument equipped with a Scanning Electron Microscope column and/or a Transmission Electron Microscope column and/or a Focused Ion Beam column.

Figure 1:
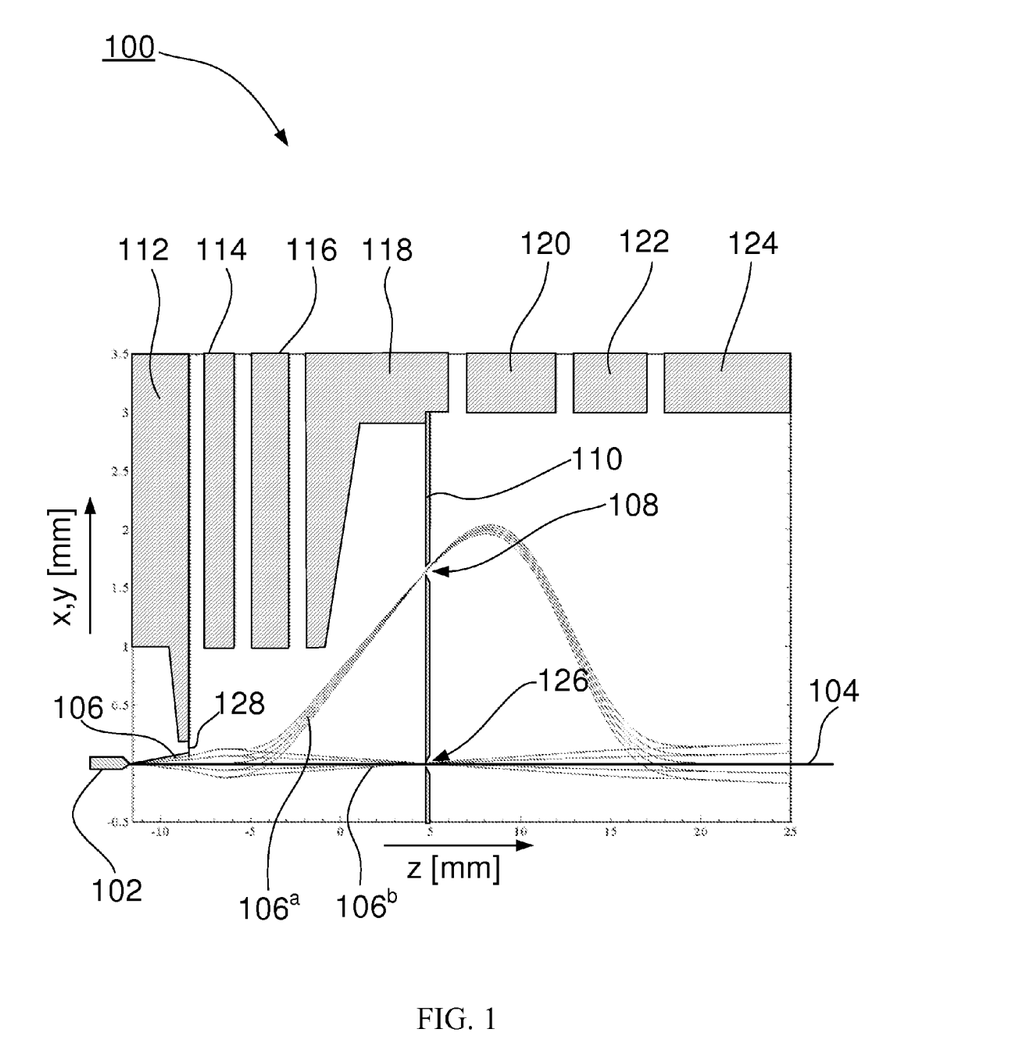
FIG. 1 schematically shows a preferred embodiment of the particle source according to the invention.
Figure 2:
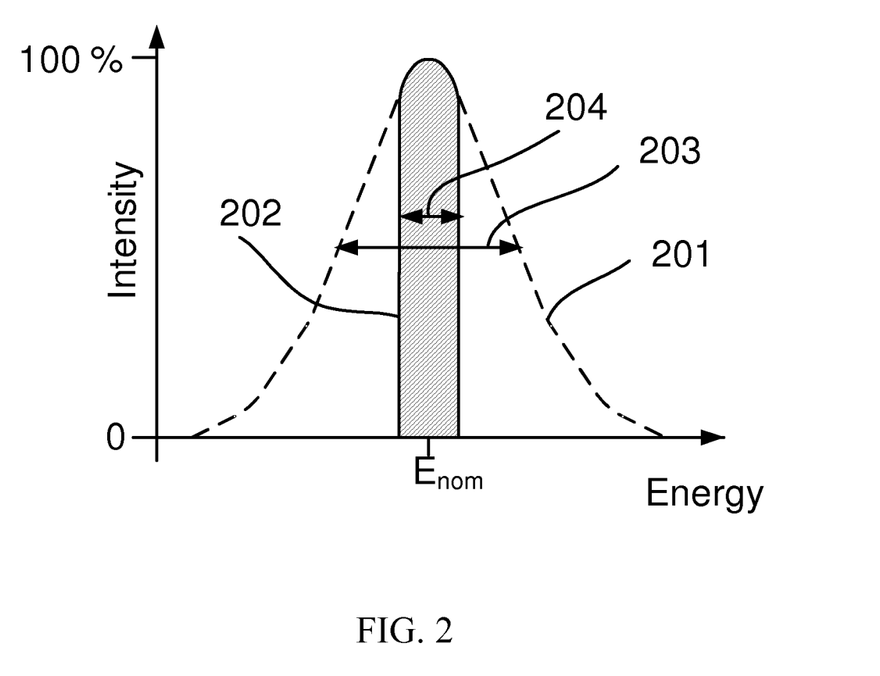
FIG. 2 schematically shows the energy distribution produced by the particle source of FIG. 1.

FIG. 1 shows a first embodiment of the particle source according to the invention. FIG. 1 shows a particle source 100 comprising a charged particle emitter 102, in this embodiment a Schottky emitter. Due to an extraction field produced by extractor 112 the emitter emits a beam of charged particles 106 round axis 104. Extractor 112 also acts as a beam limiting aperture, transmitting only part of the current emitted by the emitter. As the beam is deflected in the x-direction, a projection of the beam is shown on the x-plane, projection $106^a$, and on the y-plane, projection $106^b$. The beam is focused on energy selective diaphragm 110 as a result of axial focusing fields generated between electrodes 112, 114 and 116. It is noted that these electrodes do not form a uni-potential lens, in other words: the energy with which the electrons leave electrode 116 is not the same as with which they enter electrode 112. The beam is deflected from the axis by a deflection field generated by electrode 116, and is directed to energy selective aperture, preferably in the form of a slit 108. The slit is placed off-axis, on a position (x, y, z) with x=1.67 mm, y=0 mm and z=4.8 mm, although other positions may be used. In the shown embodiment a double focus (that is: a round image) of the emitter with a magnification of approximately 4× is formed on the slit, although other magnifications may be used.

After passing through the aperture the beam is deflected back towards the axis by a deflection field generated by electrode 120. Electrode 122 deflects the beam on the axis 104, as a result of which the beam leaves the charged particle source parallel to the axis. Slight focusing occurs by fields occurring between electrodes 120, 122 and 124, as a result of which the virtual crossover is not identical to the position of the diaphragm 110.

The optical errors are best divided into two groups: pre-slit errors, responsible for errors of the image formed on the energy selecting diaphragm, and post-slit errors, responsible for errors in the virtual image from diaphragm to the end of the source, preferably keeping a good (virtual) image and cancelling the energy dispersion.

To eliminate pre-slit coma, dipole and quadrupole fields are generated by electrode 114, 116, 120 and 122, in which the dipole fields are used to eliminate coma, and the quadrupole field(s) mainly for correcting the astigmatism resulting from the deflection of the beam. Due to the geometric properties of this design $M_x=M_y$, and only one pre-slit quadrupole field is needed, as shown in table 1 (electrode 116).

To enable the use of high beam currents without energy filtering, a central aperture 126 (on the axis 104, so with a position (x, y, z) with x=y=0 mm and z=4.8 mm), is available. In that case the beam is not deflected, and also the correction of coma and deflection astigmatism is not necessary. The diameter of this aperture can be larger than the diameter of the energy selecting aperture, thus passing all current impinging on the diaphragm.

The voltages on a segmented electrode normally result in the excitation of a multitude of multipoles. Neglecting fringe fields (thus assuming multipoles with infinite length) the axial potential $\Phi$ at the axis can be written as a function of r (the distance from the axis) and ϕ (the angular orientation) as:

$$\Phi(r, \varphi) = \hat{\Phi}_0 + \sum_{k=1}^{\infty} \left(\frac{r}{R}\right)^k Re\left[\hat{\Phi}_k e^{ik\varphi}\right] \quad [\text{-}1\text{-}]$$

in which 2·k is the multipole number, R the radius of the bore of the electrode and $\hat{\Phi}_k$ the excitation of the multipole (further also referred to as the Fourier voltage of the multipole). It is noted that k=1 corresponds with a dipole, k=2 with a quadrupole, k=3 with a hexapole, k=4 with an octupole, etc.

Figure 3:
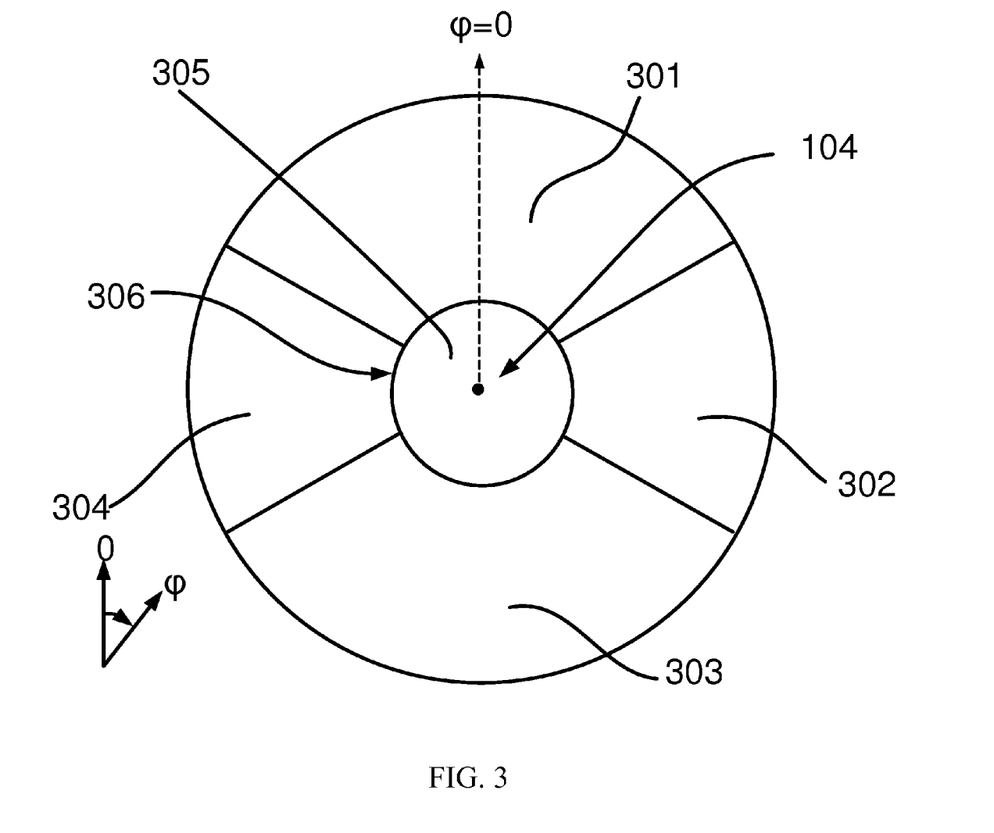
FIG. 3 schematically shows a 120°/60°/120°/60° segmented electrode.

The Fourier voltages $\hat{\Phi}_k$ are determined by the boundary condition that $\Phi(R,\phi)$ equals the voltage distribution of the (segmented) electrodes. In the special case of a 120°/60°/120°/60° segmented multipole, a dipole field with a multipole excitation (a Fourier voltage) of 1 V is generated without exciting a quadrupole or a hexapole by applying a voltage of $$\frac{\pi}{2\sqrt{3}} V$$

to one of the 120° segments (at angular orientation ϕ), $$-\frac{\pi}{2\sqrt{3}} V$$

to the opposite segment (at angular orientation ϕ+π), and connect the two 60° segments to earth. No hexapole field (k=3) is excited due to the 120°/60°/120°/160° symmetry, although higher order (odd) multipoles (k=5 . . . ∞) are excited. As known to the skilled artisan the excitation becomes smaller for higher order multipole numbers, and their effect becomes negligible.

Likewise a quadrupole field (k=2) with a multipole excitation (a Fourier voltage) of 1V is generated by applying a voltage of $$\frac{\pi}{6\sqrt{3}} V$$

to both the 120° segments and $$-\frac{\pi}{3\sqrt{3}} V$$

to the 60° segments. It is noted that in this case higher order multipoles are excited.

It is noted that a constant voltage may be added to all segments without changing the multipole excitation. This may be required to apply a constant voltage to a beam of charged particles travelling along the axis, or for generating electric fields between neighboring electrodes, thus generating electric fields along the axis for round lens excitation.

For a round lens the excitation of all segments of an electrode is identical. As a result no radial electric field in the plane of the electrode is generated, but potential differences between different electrodes with another z-position introduce an electric field between the electrodes, causing lens action. The working of such electrostatic lenses, relying on one or more electric fields along the axis, is known to the skilled artisan.

Table 1 gives an overview of the excitations, here also referred to as the Fourier voltages) used on the different electrodes for the first embodiment of the invention.

TABLE 1 electrode excitations [Fourier voltage] for the first embodiment

| Electrode | Round lens excitation with respect to emitter [Fourier voltage] | Dipole excitation [Fourier voltage] | Quadrupole excitation [Fourier voltage] |
|---|---|---|---|
| 112 | 4600 | — | — |
| 114 | 558 | 4.7 | — |
| 116 | 1000 | 124 | 3.4 |
| 118 | 1000 | — | — |
| 120 | 1500 | −724 | 55 |
| 122 | 750 | 529 | 15 |
| 124 | 1000 | — | — |

It is noted that the dipole excitation on electrode 114 is not needed for perfectly aligned electrodes and a Schottky emitter, as then the coma is negligible compared to the size of the image of the emitter on the energy selecting aperture. However, normally a dipole field at this position is preferred anyway to counter the effects of slight mis-alignments of the electrodes and/or emitter with respect to the axis.

The excitations given in table 1 result in an energy dispersion of 1.8 µm/V at the slit and an emitter magnification of 4 times. With an emitter size of approximately 30 nm (typical value for a Schottky emitter), the attainable energy width is then approximately 0.08 eV.

It is noted that in this embodiment the emitter is operated at a potential of approximately 4600 V, as is customary for Schottky emitters, and that the final energy of the electrons leaving the source is 1 keV, although other potentials and energies may be used.

It is mentioned that, for a Schottky emitter, electron-electron interactions (Coulomb interactions and trajectory displacement) of this embodiment are negligible when the current transmitted by the extractor (electrode 112) is less than approximately 30 nA, as confirmed by simulation using the formulae of G. H. Jansen, "Coulomb Interactions in Particle Beams," Adv. Electron. Electron Phys., Suppl. 21 (1990), Academic Press, New York.

It is noted that for this geometry the image at the energy selective aperture/slit is a round image as a result of the pre-slit optics: the round lens excitation of electrodes 112, 114 and 116 is used to image the emitter on the slit, the magnification in the x-z plane is made identical to that of the y-z plane as a result of the quadrupole action of electrode 116, and the focus is a coma free focus as a result of the combined deflection caused by electrodes 114 and 116.

It is further noted that this geometry and these excitations result in a source where dx/dU=0, and the position of the virtual source is thus not energy dependent. It is mentioned that dx'/dU≠0, resulting in an accepted opening angle that is energy dependent. However, this is in most cases not of any consequence.

In a second embodiment of the charged particle source according to the invention the mechanical lay-out of the electrodes is identical to the lay-out of the electrodes used for embodiment 1, but the excitation of the post-slit electrodes is different. By tuning the post-slit optics (electrodes 120, 122, and 124) both the coma, dx/dU and dx'/dU of the virtual crossover (the image of the emitter on the energy selective diaphragm) can be made zero. Thus not only the position of the virtual source is independent of the energy (dx/dU=0), but also the opening angle accepted from the emitter is energy independent (dx'/dU=0).

Table 2 gives an overview of the excitations, here also referred to as the Fourier voltages) used on the different electrodes for the second embodiment of the invention.

TABLE 2 electrode excitations [Fourier voltage] for the second embodiment.

| Electrode | Round lens excitation with respect to emitter [Fourier voltage] | Dipole excitation [Fourier voltage] | Quadrupole excitation [Fourier voltage] |
|---|---|---|---|
| 112 | 4600 | — | — |
| 114 | 558 | 4.7 | — |
| 116 | 1000 | 124 | 3.4 |
| 118 | 1000 | — | — |
| 120 | 1741 | −786 | 56 |
| 122 | 1033 | 564 | 18 |
| 124 | 727 | — | — |

It is mentioned that, as the pre-slit optics are identical to the first embodiment, for a Schottky emitter the Coulomb interactions of this embodiment are also negligible when the current transmitted by the extractor (electrode 112) is less than approximately 30 nA.

FIG. 3 shows a 120°/60°/120°/60° segmented electrode. The electrode shows 4 segments 301 . . . 304, with a central bore 305 arranged round axis 104. The first segment 301 is a 120° electrode, arranged at φ=0. Another 120° segment, segment 303, is arranged at φ=π. The two remaining segments, 60° segments 302 and 304, are positioned at φ=π/2 and φ=−π/2 (or φ=3π/2) respectively. At the edge 306 of the bore 305 the voltage of the electrodes is impressed, thus leading to the boundary conditions for formula [-1-] at radius R.

It is noted that electrodes with different symmetry then a 120°/60°/120°/60° segmented electrode can be used for exciting a quadrupole, but other symmetries either require more segments (and thus a more complicated excitation of the electrodes), or simultaneously a hexapole is excited which may introduce errors.

It is further noted that in this geometry a dipole can be excited without exciting a quadrupole or a hexapole.

Figure 4A:
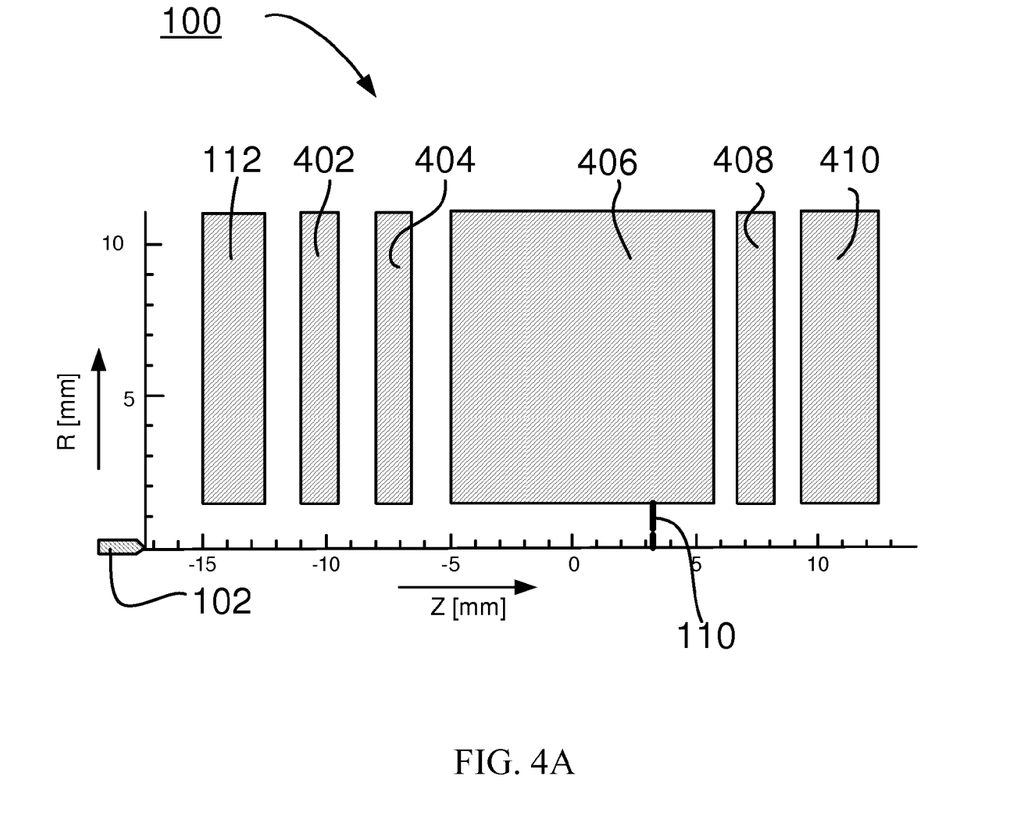
FIGS. 4A and 4B schematically show another preferred embodiment of the particle source according to the invention.
Figure 4B:
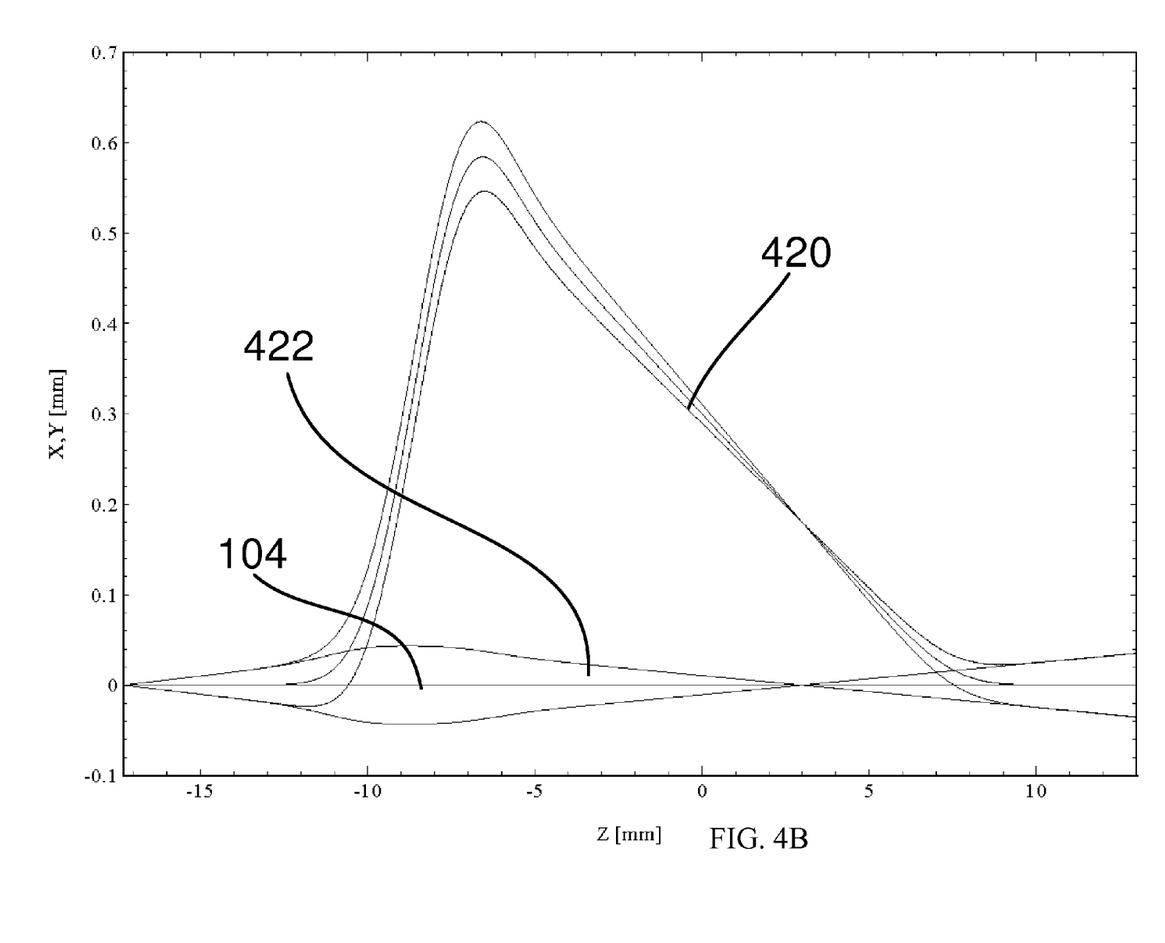

FIGS. 4A and 4B schematically show a third embodiment of the particle source according to the invention, in which FIG. 4A schematically shows the electrode lay-out and FIG. 4B schematically shows the rays.

FIG. 4A shows a particle source 100 comprising a charged particle emitter 102. Extractor 112 extracts electrons from the emitter. Electrode 402 deflects the beam of electrons from the axis, while electrode 404 deflects the beam back into the direction of the axis. Drift electrode 406 acts, together with electrode 404 and electrode 402, as a lens, while the "interior" of the electrode acts as a drift space. A focus is formed at the position of the energy selecting diaphragm 110. Electrode 408 bends the beam parallel to the axis, so that the beam exiting the source is parallel and aligned with the beam emitted by the emitter. After electrode 408 a further drift electrode 410 is placed, said further drift having identical voltages on all electrodes as drift electrode 406, and the two drift electrodes can thus be thought to be one drift electrode with a more intricate form.

Table 3 gives an overview of the excitations used on the different electrodes for the third embodiment of the invention.

TABLE 3 electrode excitations [Fourier voltage] for the third embodiment

| Electrode | Round lens excitation with respect to emitter [Fourier voltage] | Dipole excitation [Fourier voltage] | Quadrupole excitation [Fourier voltage] |
|---|---|---|---|
| 112 | 4600 | — | — |
| 402 | 555 | 251 | −0.6 |
| 404 | 527 | −193 | 17.1 |
| 406, 410 | 1000 | — | — |
| 408 | 1000 | 50 | 0.5 |

FIG. 4B shows the rays in the x-z (420) and the y-z plane (422) of the source for the third embodiment. An advantage of this embodiment compared to the first and the second embodiment is the simpler layout (less electrodes, and also less control voltages), and that the voltages are lower, resulting in cheaper electronics and less chance of sparking. It is mentioned that in the third embodiment pre-slit coma is corrected.

A disadvantage of this third embodiment compared to the first and the second embodiment is that the dispersion is not undone after the slit: $dx/dU \neq 0$, and hence the position of the virtual source as seen after the source is energy dependent and will thus show a rainbow as shown.

For the excitation shown in table 3 the image formed at the energy selecting diaphragm has a magnification of −2.65 times. The energy dispersion is 1.54 μm/V, and therefore the ratio between source size and energy dispersion is better than that shown in the first and second embodiment.

As in the other embodiments, according to the formulae of G. H. Jansen no or only a negligible amount of Boersch effect and trajectory displacement occurs for a current of less than 30 nA falling on the energy selective diaphragm.

It is mentioned that for all three embodiments a central hole in the energy selecting diaphragm is illuminated when the dipole fields are absent. Obviously no quadrupole fields are necessary then either to manipulate the beam. In this manner a central hole can be used to obtain a large beam current without any energy filtering. A misalignment of the emitter with respect to the axis may necessitate a compensating dipole field, e.g. caused by an electrode (114, 402) immediately after the extractor.

The person skilled in the art will recognize that the invention is applicable to many more embodiments, each having advantages and disadvantages with respect to isotropy of the image magnification, coma correction, correction of the position of the virtual source for different energies ($dx/dU=0$), choice of magnification of the emitter, choice of energy of the beam exiting the source, choice of energy width, choice of beam current, Coulomb interactions, etc.

As known to the skilled artisan, optical elements, such as electrostatic or magnetic round lenses, correctors, deflectors, stigmators, etc. can be used to manipulate the beam between the source and a sample to be studied. During this manipulation the size of the image of the source can be altered, and also the beam energy can be changed by either accelerating or decelerating the charged particles.

Although the description of the present invention above is mainly directed at an apparatus, it should be recognized that a method of using the claimed apparatus would further be within the scope of the present invention. Further, it should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

The invention has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for use with an apparatus according to the present invention are commercially available, for example, from FEI Company, the assignee of the present application.

In the following discussion and in the claims, the terms "including" and "comprising" are used in an open-ended fashion, and thus should be interpreted to mean "including, but not limited to . . . ." The term "FIB" or "focused ion beam" is used herein to refer to any collimated ion beam, including a beam focused by ion optics and shaped ion beams. To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim as follows:

1. A charged particle source with integrated electrostatic energy filter, the charged-particle source for use in a charged-particle apparatus, the charged particle source comprising:
   a charged particle emitter for producing a beam of charged particles around an axis,
   a beam limiting aperture for selecting a part of the beam produced by the emitter, the beam limiting aperture positioned around the axis, thereby selecting an axial part of the beam,
   an energy selecting aperture in an energy selective diaphragm for selecting particles with a desired energy spread from the part of the beam that passed through the beam limiting aperture,
   electrodes for forming a focus of the charged particle emitter on the energy selective diaphragm, and
   electrodes for producing electrostatic dipole fields for deflecting the beam,
   in which the charged particle emitter and the electrodes are arranged round the axis, the axis being a straight axis.

2. The charged particle source of claim 1 in which at least some of the electrodes are equipped to generate weak quadrupole fields for correcting astigmatism and/or coma of the beam exiting the source.

3. The charged particle source of claim 1 in which the electrodes in working are excited such that the beam exiting the source does not show energy dispersion.

4. The charged particle source of claim 1 comprising at least two energy selective apertures, the two energy selective apertures having different dimensions and/or different distances from the axis, the two energy selective apertures for passing charged particle beams with different energy width and different beam current.

5. The charged particle source of claim 4 in which one of the energy selective apertures is located at the axis for passing a beam of particles without energy filtering said beam.

6. The charged particle source of claim 1 in which the charged particle emitter is a electron source of the group of thermionic sources, thermal field emitters, cold field emitters, Schottky emitters, carbon nanotubes, and semiconductor emitters, or an ion source of the group of liquid metal ion sources, gas ion sources, and liquid helium sources.

7. The charged particle source of claim 1 in which at least one of the electrodes is a 120°/60°/120°/60° segmented electrode.

8. The charged particle source of claim 1 in which in use the coma of the image formed on the energy selective diaphragm has a diameter less than the geometric image size of the emitter.

9. The charged particle source of claim 1 in which additional electrodes are present for forming a cross-over between the emitter and the energy selective diaphragm.

10. Charged-particle apparatus equipped with a charged particle source according to of claim 1.

11. The charged-particle apparatus of claim 10, in which the charged-particle apparatus is equipped with a Scanning Electron Microscope (SEM) column and/or a Transmission Electron Microscope (TEM) column and/or a Focused Ion Beam (FIB) column.

12. A charged particle source with integrated electrostatic energy filter, the charged-particle source for use in a charged-particle apparatus, the charged particle source comprising:
   a charged particle emitter for producing a beam of charged particles along a first axis;
   a beam limiting aperture for selecting a part of the beam produced by the emitter, the beam limiting aperture positioned around the axis, thereby selecting an axial part of the beam;
   an energy selecting aperture in an energy selective diaphragm for selecting particles with a desired energy spread from the part of the beam that passed through the beam limiting aperture;
   electrodes for forming a focus of the charged particle emitter on the energy selective diaphragm; and
   electrodes for producing electrostatic dipole fields for deflecting the beam;
   wherein the electrodes for forming a focus and the electrodes for deflecting the beam are all arranged to be concentric with the first axis.

13. The charged particle source of claim 12 in which at least some of the electrodes are equipped to generate weak quadrupole fields for correcting astigmatism and/or coma of the beam exiting the source.

14. The charged particle source of claim 12 in which the electrodes in working are excited such that the beam exiting the source does not show energy dispersion.

15. The charged particle source of claim 12 comprising at least two energy selective apertures, the two energy selective apertures having different dimensions and/or different distances from the axis, the two energy selective apertures for passing charged particle beams with different energy width and different beam current.

16. The charged particle source of claim 15 in which one of the energy selective apertures is located at the axis for passing a beam of particles without energy filtering of said beam.

17. The charged particle source of claim 12 in which the charged particle emitter is a electron source of the group of thermionic sources, thermal field emitters, cold field emitters, Schottky emitters, carbon nanotubes, and semiconductor emitters, or an ion source of the group of liquid metal ion sources, gas ion sources, and liquid helium sources.

18. The charged particle source of claim 12 in which at least one of the electrodes is a 120°/60°/120°/60° segmented electrode.

19. The charged particle source of claim 12 in which the coma of the image formed on the energy selective diaphragm has a diameter less than the geometric image size of the emitter.

20. The charged particle source of claim 1 further comprising additional electrodes for forming a crossover between the emitter and the energy selective diaphragm.

* * * * *